United States Patent [19]
Hanagasaki

[11] Patent Number: 4,746,629
[45] Date of Patent: May 24, 1988

[54] PROCESS OF FABRICATING SEMICONDUCTOR DEVICE INVOLVING PLANARIZATION OF A POLYSILICON EXTRINSIC BASE REGION

[75] Inventor: Osamu Hanagasaki, Shizuoka, Japan

[73] Assignee: Yamaha Corporation, Shizuoka, Japan

[21] Appl. No.: 72,166

[22] Filed: Jul. 9, 1987

[30] Foreign Application Priority Data

Jul. 11, 1986 [JP] Japan ................. 61-163336

[51] Int. Cl.⁴ ............... H01L 21/225; H01L 21/385
[52] U.S. Cl. ................................. 437/162; 437/31;
  437/228; 437/233; 148/DIG. 11; 357/34
[58] Field of Search ............... 437/31, 33, 162, 191,
  437/233, 238, 228, 225, 229; 148/DIG. 10,
  DIG. 11; 357/34, 59 H; 156/653, 657, 643

[56] References Cited

U.S. PATENT DOCUMENTS

| | | | |
|---|---|---|---|
| 4,252,582 | 2/1981 | Anantha et al. | 437/31 |
| 4,274,909 | 6/1981 | Venkataraman et al. | 437/31 |
| 4,378,630 | 4/1983 | Horng et al. | 437/233 |
| 4,545,114 | 10/1985 | Ito et al. | 437/31 |
| 4,693,782 | 9/1987 | Kikuchi et al. | 156/697 |

*Primary Examiner*—Brian E. Hearn
*Assistant Examiner*—Kevin McAndrews

*Attorney, Agent, or Firm*—Burns, Doane, Swecker & Mathis

[57] ABSTRACT

A process of fabricating a semiconductor device comprising the steps of forming a dielectric layer overlying a doped semiconductor layer, forming a first insulator layer on the dielectric layer, etching the dielectric layer and the insulator layer to form a bump region comprising coextensively patterned portions of the dielectric and insulator layers, forming a second insulator layer partly on the doped semiconductor layer and partly on the bump region, conformally forming on the second insulator layer an undoped polycrystalline semiconductor layer having a step portion, forming on the polycrystalline semiconductor layer a planarizing layer covering the step portion of the polycrystalline semiconductor layer, etching back the polycrystalline semiconductor layer and the planarizing layer until the second insulator layer has a surface portion exposed over the bump region, etching the first and second insulator layers with the remaining portion of the polycrystalline semiconductor layer used as a mask for forming an opening in part extending to the surface of the dielectric layer and having a marginal groove portion extending to the surface of the doped semiconductor layer, and thereafter forming various desired device regions through and in alignment with this opening.

9 Claims, 8 Drawing Sheets

PROCESS OF FABRICATING SEMICONDUCTOR DEVICE INVOLVING PLANARIZATION OF A POLYSILICON EXTRINSIC BASE REGION

FIELD OF THE INVENTION

The present invention relates to a process of fabricating a semiconductor device and, more particularly, to a process of fabricating a semiconductor device having a contact hole which can be advantageously used for the self-aligned formation of active device regions on a semiconductor substrate.

SUMMARY OF THE INVENTION

In accordance with the present invention, there is provided a process of fabricating a semiconductor device comprising the steps of (a) preparing a doped semiconductor layer, (b) forming a dielectric layer overlying the doped semiconductor layer, (c) forming a first insulator layer on the dielectric layer, (d) selectively etching the dielectric layer and the insulator layer to form a bump region comprising coextensively patterned portions of the dielectric and insulator layers, (e) forming a second insulator layer partly on the doped semiconductor layer and partly on the bump region, (f) conformally forming on the second insulator layer an undoped polycrystalline semiconductor layer having a step portion, (g) forming on the polycrystalline semiconductor layer a planarizing layer covering the step portion of the polycrystalline semiconductor layer, (h) etching back the polycrystalline semiconductor layer and the planarizing layer until the second insulator layer has a surface portion exposed over the bump region, (i) selectively etching the first and second insulator layers with the remaining portion of the polycrystalline semiconductor layer used as a mask for forming an opening in part extending to the surface of the dielectric layer and having a marginal groove portion extending to the surface of the doped semiconductor layer, and (j) thereafter forming various desired device regions through and in alignment with this opening.

BRIEF DESCRIPTION OF THE DRAWINGS

The drawbacks of a prior-art semiconductor device fabrication process and the features and advantages of a process according to the present invention will be more clearly understood from the following description taken in conjunction with the accompanying drawings in which.

DESCRIPTION OF THE PRIOR ART

Description will be hereinafter made with reference to FIGS. 1A to 1F in regard to a known self-aligned process of fabricating a semiconductor bipolar device featuring micro-miniaturized base-emitter configuration. The process of the type herein shown is per se well known in the art and is taught in, for example, Japanese Provisional Patent Publication (Kokai) No. 60-216581.

Figure 1A:
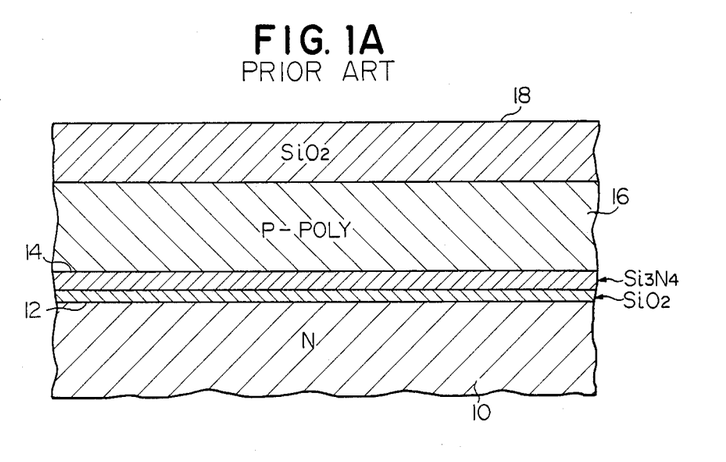
FIGS. 1A to 1F are fragmentary cross sectional views showing semiconductor structures formed in the course of a known self-aligned semiconductor device fabrication process.

The prior-art semiconductor device fabrication process starts with preparation of an n-type silicon layer 10 shown in FIG. 1A. Though not shown in the drawings, this n-type silicon layer 10 is circumscribed by a thick field oxide layer defining the active area of the bipolar device to be fabricated. This field oxide layer is usually formed by local-oxidation-of-silicon (LOCOS) techniques. The silicon layer 10 may be epitaxially grown on a lightly doped p-type silicon substrate.

On the n-type silicon layer 10 is thermally grown a thin silicon oxide film 12 for relieving a thermal stress which may be created during the device fabrication process. A silicon nitride film 14 is then deposited on the oxide film 12 by chemical vapor deposition (CVD) techniques. On this silicon nitride film 14 is formed a thick polysilicon layer 16 doped with an acceptor-type dopant such as boron, whereupon a silicon oxide layer 18 is formed on this polysilicon layer 16. Each of these polysilicon and silicon oxide layers 16 and 18 is also formed by chemical vapor deposition techniques.

Figure 1B:
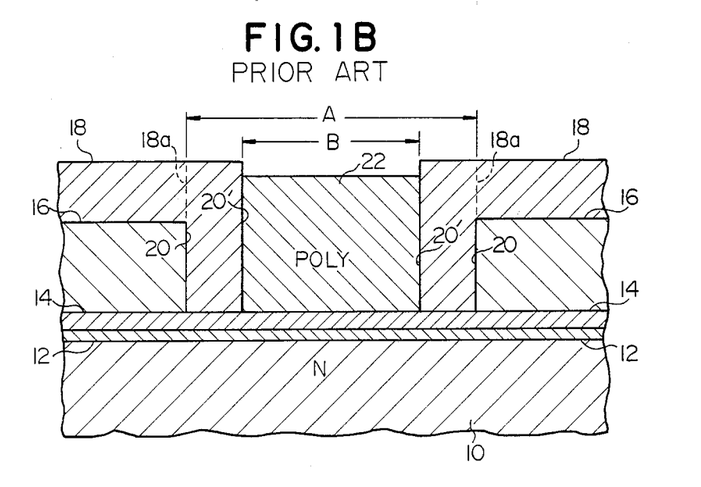

The silicon oxide and doped polysilicon layers 18 and 16 are then selectively etched to form an opening 20 extending through the layers 18 and 16 to the surface of the nitride film 14 as shown in FIG. 1B. The opening 20 is configured in cross section to define the desired base region of the device to be fabricated and has a predetermined width "A" of, for example, about 1.5 micron. A vertical additional silicon oxide layer is then thermally grown on the side walls of the polysilicon and silicon oxide layers 16 and 18 thus formed with the opening 20. The additional silicon oxide layer, which extends to the surface of the silicon nitride film 14, integrally merges with the horizontal silicon oxide layer 18 overlying the p+-type polysilicon layer 16 and is thus shown as a marginal portion 18a of the oxide layer 18. By this additionally formed marginal portion 18a of the silicon oxide layer 18 is defined an opening 20' which is smaller in cross section than the original opening 20 and which has a width "B" of, for example, about 1.2 micron.

An undoped polysilicon layer is conformally deposited on the resultant semiconductor structure by chemical vapor deposition techniques so as to cover the silicon oxide layer 18 and fill up the opening 20'. This conformal polysilicon layer is etched back until the surface of the underlying silicon oxide layer 18 is completely exposed, thus leaving a polysilicon mask region 22 in the opening 20' as shown.

Figure 1C:
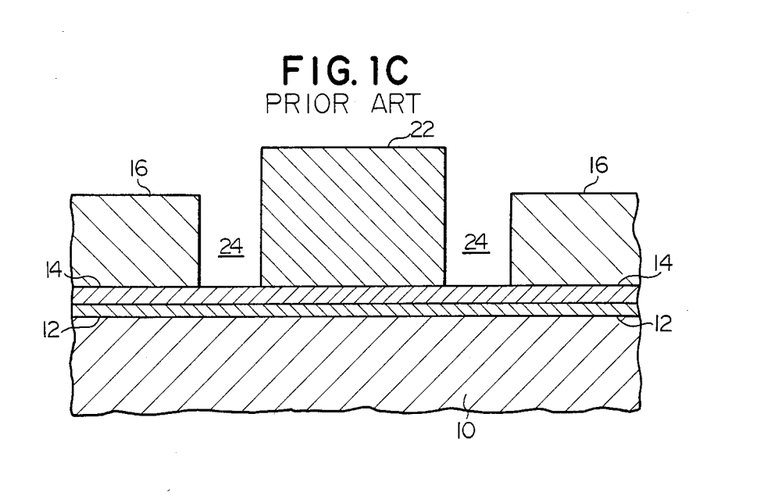
Figure 1D:
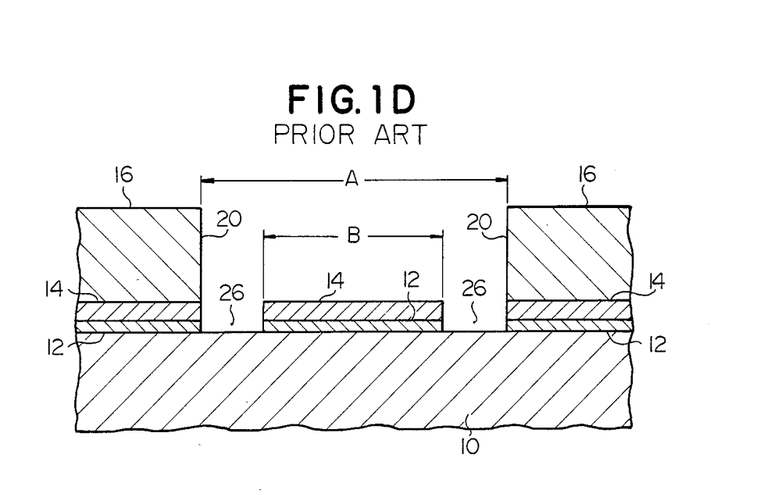

The silicon oxide layer 18 is then completely etched away with the doped polysilicon layer 16 and undoped polysilicon mask region 22 used as masks. An opening 24 extending to the surface of the silicon nitride film 14 is thus formed between the undoped polysilicon mask region 22 and the doped polysilicon layer 16 surrounding the mask region 22 as shown in FIG. 1C. Wet etching with hydrofluoric acid is used for this etching process. The polysilicon layer 16 and polysilicon mask region 22 are further used as masks to have the silicon nitride film 14 etched away from the bottom of the opening 24 thus formed around the polysilicon mask region 22. The silicon nitride film 14 now has portions left underneath the polysilicon mask region 22 as well as the doped polysilicon layer 16. The silicon oxide film 12 still remaining at the bottom of the opening 24 around the polysilicon mask region 22 is then etched away also with the polysilicon layer 16 and polysilicon mask region 22 used as masks. The surface of the n-type silicon layer 10 is now exposed between those portions of the silicon oxide and nitride films 12 and 14 which underlie the polysilicon layer 16 and those portions of the oxide and nitride films 12 and 14 which underlie the polysilicon mask region 22. Reactive ion etching is usually used for the selective removal of the nitride film 14 and wet etching used for the selective removal of the oxide film 12. The undoped polysilicon mask region 22 is then removed by wet etching with a solution of, for example, potassium hydroxide. During this etching process, the polysilicon layer 16 remains practically insentitive to the attack of etchant because of the difference in etch rate between the boron-doped and undoped polysilicon materials. FIG. 1D shows the semiconductor structure thus obtained at this stage of the fabrication process.

As will be seen from FIG. 1D, the opening 20 originally formed in the doped p+-type polysilicon layer 16 and having the width "A" is now restored with its bottom defined in part by the exposed surface of the n-type silicon layer 10 and in part by the patterned bump region of the oxide and nitride films 12 and 14 having the width "B". An opening 26 is thus formed through the oxide and nitride films 12 and 14 around such a patterned bump region to provide a self-aligned contact hole for the base of the device to be fabricated. This opening 26 is congruent in cross section with the marginal portion 18a of the silicon oxide layer 18 formed at the process stage shown in FIG. 1B.

Figure 1E:
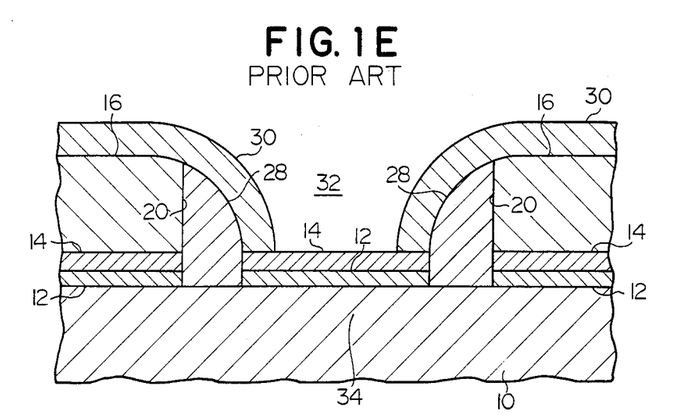
Figure 1F:
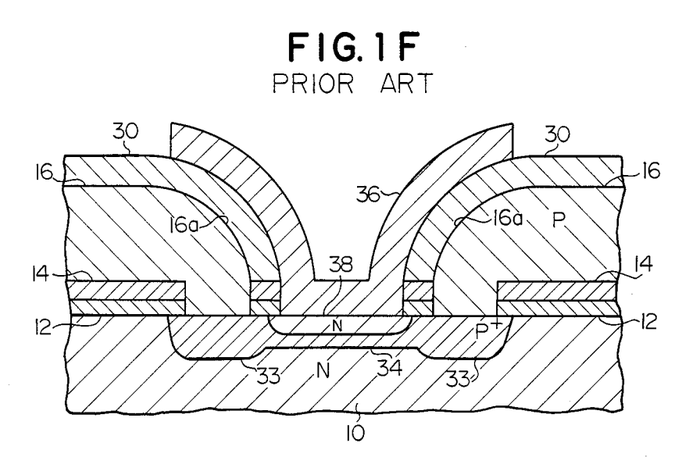

A fresh undoped polysilicon layer is then conformally deposited on the structure as by chemical vapor deposition techniques and is anisotropically etched away from the surface of the doped polysilicon layer 16 by, for example, reactive ion etching techniques. An undoped polysilicon filament region 28 is now left on the side walls of the doped polysilicon layer 16 and oxide and nitride films 12 and 14, extending to the surface of the n-type silicon layer 10 and filling up the opening 26 in the films 12 and 14, as shown in FIG. 1E. The resultant structure is heated to thermally oxidate surface portions of the polysilicon layer 16 and filament region 28 to form a silicon oxide layer 30 covering the layer 16 and filament region 28. The silicon oxide layer 30 terminates at the surface of the nitride film 14 surrounded by the filament region 28 and defines an opening 32 extending to the surface of the nitrode film 14. During this thermal oxidation process, the boron atoms present in the doped polysilicon layer 16 are outdiffused into the adjacent undoped polysilicon filament region 28, which is thus converted into an integral side wall portion 16a of the p+-type polysilicon layer 16 as shown in FIG. 1F. This p+-type silicon layer 16 is to be used to provide a contact region for the base of the device to be fabricated. The boron atoms in the polysilicon layer 16 are further outdiffused through the filament region 28 into the n-type silicon layer 10 and form a p+-type marginal base region 33 in the layer 10 immediately below the integral side wall portion 16a of the polysilicon layer 16.

The portion of the silicon nitride film 14 exposed at the bottom of the opening 32 is then etched away by, for example, reactive ion etching techniques with the silicon oxide layer 30 used as a mask. Subsequently, the silicon oxide film 12 still remaining at the bottom of the opening 32 is selectively etched away using suitable wet etching techniques so that the n-type silicon layer 10 is exposed at the bottom of the opening 32. An acceptor-type dopant is injected as by implant of boron ions into the n-type silicon layer 10 through the opening 32, followed by annealing of the resultant structure to form a p-type base region 34 merging with the marginal base region 33 in the silicon layer 10. A top-level polysilicon layer doped with a donor-type dopant such as arsenic is deposited on the resultant semiconductor structure by, for example, chemical vapor deposition techniques. The top-level polysilicon layer is then photolithographically patterned and etched to form an emitter contact region 36 extending into contact with the surface of the silicon layer 10 as shown. The resultant structure is heated so that the arsenic atoms in the doped polysilicon layer 36 are outdiffused into the silicon layer 10 and form an n+-type emitter region 38 within the p-type base region 34 in the layer 10. Metal electrodes are then formed to provide connection to the p+-type polysilicon layer 16 forming the base contact region through the silicon oxide layer 30 and to the polysilicon layer 36 forming the emitter contact region, though not shown in the drawings.

A bipolar transistor device is thus fabricated which comprises the base contact region 16, base region 34, emitter contact region 36 and emitter region 38. These regions 16, 34, 36 and 38 are all self-aligned through the base contact hole provided by the opening 26 formed at the process stage shown in FIG. 1D and contribute to microminiaturization of the device structure. The base contact hole formed by the opening 26 has a width substantially equal to the difference between the width "A" of the opening 20 originally formed at the process stage shown in FIG. 1B.

The prior-art self-aligned semiconductor device fabrication process hereinbefore described has a problem in that there must be formed not only the polysilicon layer 16 for the wiring of the base region 34 but also a polysilicon layer to provide the mask region 22 for the patterning and etching of the silicon oxide layer 18 and the silicon oxide and nitride films 12 and 14. The requirement for the provision of such a region 22 adds to the number of the steps of the fabrication process which include the steps for the formation and removal of the region 22. Another problem arises from the fact that the high-temperature processes for the chemical vapor deposition and thermal oxidation steps are performed with the silicon nitride film 14 left on almost all the area of the substrate. This may cause the substrate to warp during the fabrication process and would invite deterioration in the accuracy in patterning the various layers and regions to be formed on the substrate. The present invention contemplates elimination of these problems which have thus far been inherent in the described prior-art semiconductor device fabrication techniques.

DESCRIPTION OF THE PREFERRED EMBODIMENTS

Description will be hereinafter made with reference to FIGS. 2A to 2I in regard to self-aligned process of fabricating a semiconductor bipolar device in accordance with the present invention.

Figure 2A:
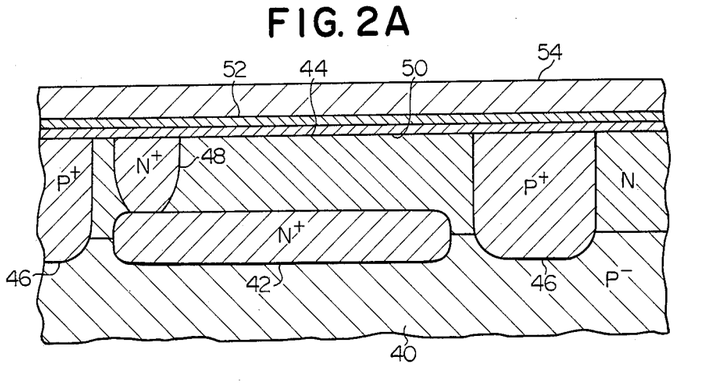
FIGS. 2A to 2I are fragmentary cross sectional views showing semiconductor structures formed in the course of a process according to the present invention.

(1) The semiconductor device fabrication process according to the present invention starts with preparation of a lightly doped p−-type silicon substrate 40 shown in FIG. 2A, A thin silicon oxide film (not shown) is formed on the surface of the substrate 40 by thermal oxidation and is patterned and etched to form an opening for defining the collector region of the bipolar device to be fabricated. Ions of a donor-type dopant such as typically antimony are then injected in the p−-type silicon substrate 40 through the opening in the silicon oxide film to form a heavily doped n+-type buried layer 42 in the substrate 40. Upon removal of the top-level silicon oxide film, a lightly doped n-type silicon epitaxial layer 44 is grown on the substrate 40. Another thin silicon oxide film (not shown) is then formed on the surface of the silicon epitaxial layer 44 also by thermal oxidation and is patterned and etched to form a closed-loop opening to define the desired active area of the bipolar device to be fabricated. An acceptor-type dopant such as typically boron is diffused into the resultant structure through the opening in this oxide film to form a heavily doped p+-type silicon layer 46. This p+-type silicon layer 46 is formed to extend into the p−-type silicon substrate 40 and provides a device isolation layer circumscribing the active area of the device to be fabricated. Such a device isolation layer may be provided by a patterned dielectric layer of, for example, silicon dioxide formed by local-oxidation-of-silicon techniques using a patterned layer of silicon oxide used as a mask.

The silicon oxide film on the structure is further selectively etched to form an opening over a portion of the n+-type buried layer 42. Ions of a donor-type dopant such as phosphorus are injected through this opening into the n-type silicon epitaxial layer 44 overlying the buried layer 42 to form a heavily doped n+-type collector lead region 48 extending to the n+-type buried layer 42. The silicon oxide is then thoroughly removed so that the structure is exposed throughout its area.

On the surface of the resultant structure is then formed a dielectric layer consisting of thin silicon oxide and nitride films 50 and 52. The silicon oxide film 50 is thermally grown on the surface of the silicon layer 44 to a thickness of, for example, 500Å. The silicon nitride film 52 is thereafter deposited on the oxide film 50 to a thickness of, for example, 1000Å typically by chemical vapor deposition techniques. The silicon oxide film 50 is provided for the purpose of relieving a thermal stress which may be created during the device fabrication process. As will be understood as the description proceeds, the silicon nitride film 52 is to be used to separate the base and emitter contact regions of the device to be fabricated. On this silicon nitride film 52 is formed a relatively thick silicon oxide layer 54 typically also by chemical vapor deposition techniques. It is in this instance desirable that the silicon oxide layer 54, which is formed typically to a thickness of 3000Å, be thicker than the underlying silicon nitride film 52 for the reason to be explained. FIG. 2A shows the semiconductor structure obtained at this stage of the device fabrication process.

Figure 2B:
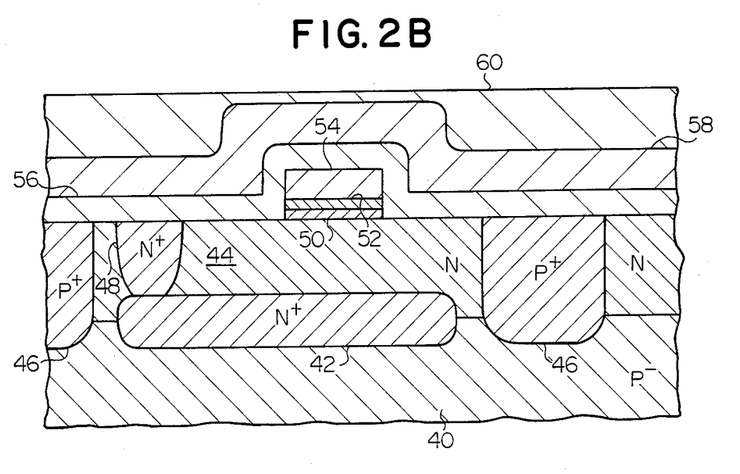

(2) A photoresist mask (not shown) is placed on this semiconductor structure whereby the silicon oxide layer 54 and silicon nitride and oxide films 52 and 50 are patterned and etched away to leave a patterned bump region of these films 50 and 52 and layer 54 on the silicon epitaxial layer 44 as shown in FIG. 2B. A relatively thick silicon oxide layer 56 is conformally deposited on the resultant semiconductor structure and is then covered with an undoped polysilicon layer 58, each of the layers 56 and 58 being formed typically by chemical vapor deposition techniques. As will be understood as the description proceeds, the undoped polysilicon layer 58 is to form part of a wiring layer for the base of the device to be fabricated. Thus, the thickness to which the silicon oxide layer 56 is deposited is selected in consideration of the the width of the contact hole for the base of the device to be fabricated. A suitable photoresist material is then spun and thereafter cured on to the resultant semiconductor structure to form a planarzing photoresist layer 60 covering the entire surface and accordingly the step portion of the undulating undoped polysilicon layer 58, as shown in FIG. 2B. If desired, another type of planarizing material such as spin-on-glass (SOG) may be used in lieu of the photoresist material.

Figure 2C:
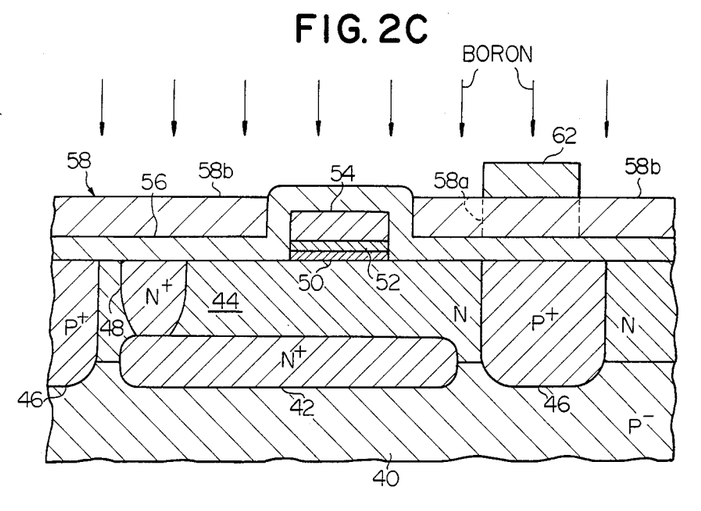

(3) The photoresist layer 60 and undoped polysilicon layer 58 are then etched back until the surface of the underlying silicon oxide layer 56 is exposed over its area in part overlying the oxide layer 54 and in part extending on the side wall of the patterned bump region of the oxide and nitride films 50 and 52 and oxide layer 54, as will be seen from Fig. 2C. The process parameters for this etchback process are selected to provide substantially equal etch rates for the photoresist layer 60 and undoped polysilicon layer 58. Reactive ion etching (RIE) techniques may be used for this etchback process so that the etchback process can be performed without having recourse to the use of a photolithographic mask. It may be noted that the thickness of the polysilicon layer 58 on the unexposed area of the silicon oxide layer 56 is slightly reduced as a result of this etchback process. The thickness to which the undoped polysilicon layer 58 is deposited during the process stage described with reference to FIG. 2B is for this reason selected so that the polysilicon layer 58 thus thinned after the etchback process is still thick enough to provide the wiring layer for the base of the device to be fabricated.

Another photoresist layer is then formed, patterned and selectively etched away to leave a masking photoresist region 62 on a desired portion of the residual undoped polysilicon layer 58. The photoresist region 62 is used as a mask to inject ions of an acceptor-type dopant such as boron into the unmasked portion of the polysilicon layer 58 with a considerably large dose, as indicated by arrows in FIG. 2C. As a result of this ion implantation process, the initially undoped polysilicon layer 58 has an undoped or lightly doped, highly resistive portion 58a underneath the photoresist region 62 and a heavily doped conductive p+-type portion 58b surrounding the highly resistive portion 58a. FIG. 2C shows the semiconductor structure obtained at this stage of the device fabrication process. The photoresist region 62 is stripped off upon completion of the ion implantation with boron.

Figure 2D:
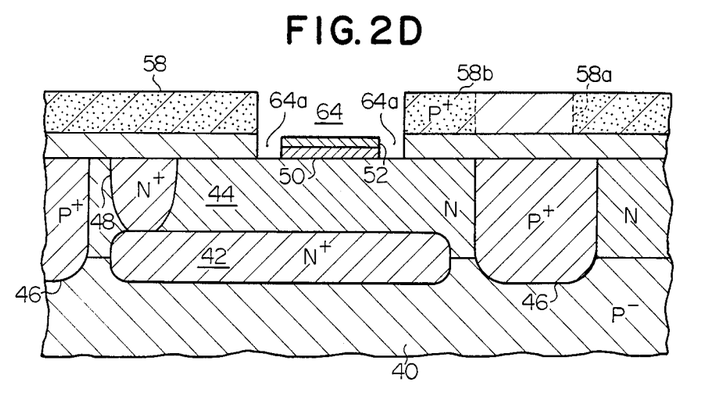

(4) The silicon oxide layer 56 is then selectively etched and concurrently the silicon oxide layer 54 completely etched away by anisotropic etching techniques with the polysilicon layer 58 used as a mask. Through the polysilicon layer 58 and silicon oxide layer 56 is thus formed an opening 64 extending to the surface of the n-type silicon epitaxial layer 44 with the silicon nitride layer 52 exposed to the opening 64 as shown in FIG. 2D. The n-type silicon epitaxial layer 44 now has an area circumscribing the patterned bump region of the silicon oxide and nitride films 50 and 52 and exposed to a marginal groove portion 64a forming part of and located at the bottom of the opening 64. It will be understood that the marginal groove portion 64a thus forming part of the opening 64 has a width substantially equal to the thickness to which the silicon oxide layer 56 is formed at the process stage described with reference to FIG. 2B. The marginal groove portion 64a thus formed around the patterned bump region of the coextensive oxide and nitride films 50 and 52 is to provide a self-aligned contact hole for the base of the device to be fabricated. FIG. 2D shows the semiconductor structure thus obtained at this stage of the fabrication process.

Figure 2E:
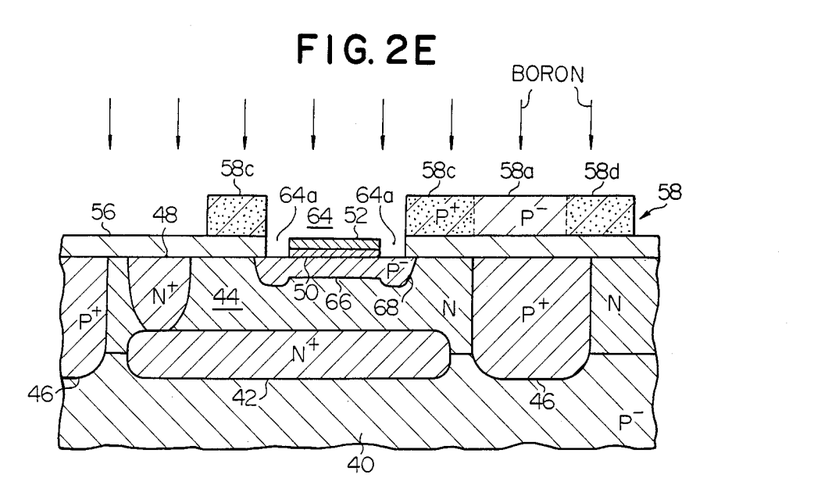

(5) Ions of an acceptor-type dopant such as typically boron are then injected into the n-type silicon epitaxial layer 44 through the marginal groove portion 64a of the opening 64 with the polysilicon and silicon oxide layers 58 and 56 used as masks. Thus, a lightly doped p⁻-type active base region 66 is formed underneath the silicon oxide film 50 and a lightly doped p⁻-type marginal base region 68 formed underneath the marginal groove portion 64a and surrounding the active base region 66 as shown in FIG. 2E. By this ion implantation, the active base region 66 is doped with ions of boron injected into the epitaxial layer 44 directly from the marginal groove portion 64a of the opening 64 and the marginal base portion 68 is doped with ions injected through the patterned bump region of the nitride and oxide films 52 and 50 from the opening 64. The effective p-n junction formed between the n-type silicon epitaxial layer 44 and the active base region 66 is for this reason shallower than the bottom of the marginal base region 68 formed around the active base region 66. It may further be noted that ions of boron are also injected into the highly resistive portion 58a of the polysilicon layer 58 so that the resistivity of the portion 58a slightly decreases as a result of the ion implantation process. Subsequently to the ion implantation process, the polysilicon layer 58 is photolithographically patterned and etched to form a closed-loop first wiring strap portion 58c circumscribing the opening 64 and a second wiring strap portion 58d merging with the first wiring strap portion 58c through the highly resistive portion 58a. It is apparent that these first and second wiring strap portions 58c and 58d have resulted from part of the heavily doped conductive p⁺-type portion 58b of the polysilicon layer 58 shown in FIG. 2D.

Figure 2F:
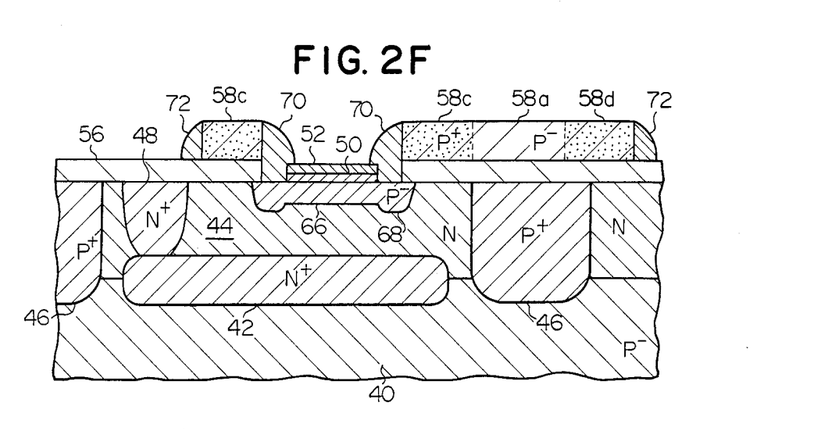

(6) A fresh undoped polysilicon layer is then conformally deposited on the structure as by chemical vapor deposition techniques and is anisotropically etched away typically by reactive ion etching techniques. Undoped polysilicon filament regions are thus formed which include a filament region 70 on the side wall of the first wiring strap portion 58c and a filament region 72 on the side wall of the second wiring strap portion 58d as shown in FIG. 2F. The filament region 70 on the side wall of the first wiring strap portion 58c extends to the surface of the p⁻-type marginal base region 68 in the n-type silicon layer 44 and fills up the marginal groove portion 64a of the opening 64. The filament region 70 on the side wall of the second wiring strap portion 58d extends to the surface of the silicon oxide layer 56.

Figure 2G:
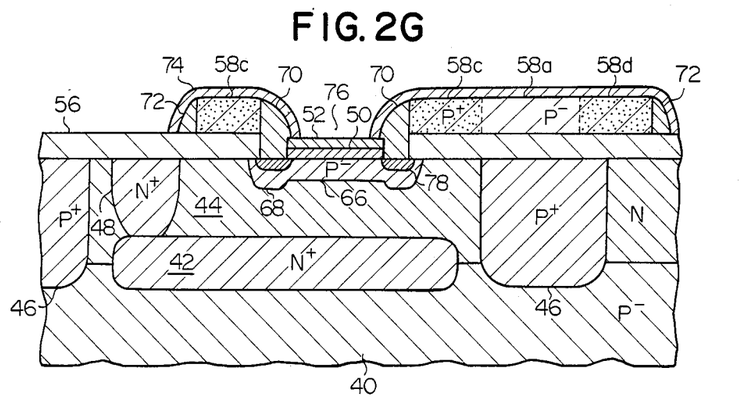
Figure 2H:
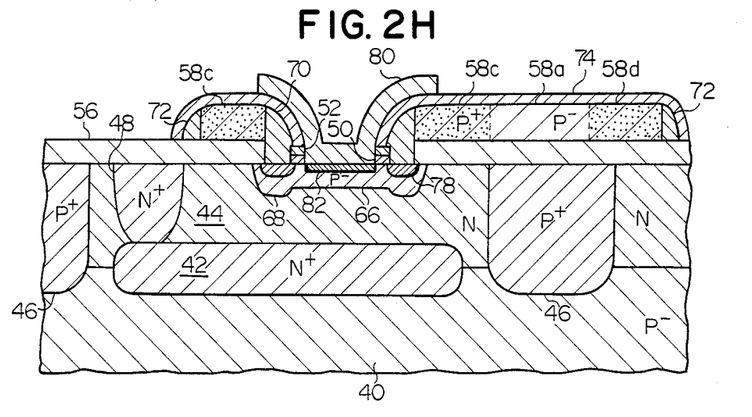

(7) The resultant semiconductor structure is heated to thermally oxidate surface portions of the polysilicon layer 58 and filament regions 70 and 72 to form a silicon oxide layer 74 covering the layer 58 and filament regions 70 and 72 as shown in FIG. 2G. The silicon oxide layer 74 terminates at the surface of the nitride film 52 surrounded by the filament region 70 and defines an opening 74 extending to the surface of the nitride film 52. During this thermal oxidation process, the boron atoms present in the heavily doped first wiring strap portion 58c of the polysilicon layer 58 are outdiffused into the adjacent undoped polysilicon filament region 70, which is thus converted into an integral side wall of the p⁺-type wiring strap portion 58c as shown. The p⁺-type silicon layer 58 including such an integral side wall is to be used to provide a contact region for the base of the device to be fabricated. The boron atoms in the heavily doped wiring strap portion 58c of the polysilicon layer 58 are further outdiffused through the filament region 70 into the p⁻-type marginal base region 68 in the n-type silicon layer 44. A heavily doped p⁺-type base contact area 78 is thus formed in the base region 68 immediately below the filament region 70 or now integral side wall portion of the polysilicon layer 58.

(8) The portion of the silicon nitride film 52 exposed at the bottom of the opening 76 is then etched away by, for example, reactive ion etching techniques with the silicon oxide layer 74 used as a mask. Subsequently, the silicon oxide film 50 still remaining at the bottom of the opening 74 is selectively etched away using suitable wet etching techniques so that the p⁻-type active base region 66 in the n-type silicon layer 44 is exposed at the bottom of the opening 74 as will be seen from FIG. 2H. An n⁺-type polysilicon layer doped with a donor-type dopant such as typically arsenic or phosphorus is conformally deposited on the resultant structure by, for example, chemical vapor deposition techniques. The top-level polysilicon layer is then photolithographically patterned and etched to form an n⁺-type emitter contact region 78 extending into contact with the surface of the p⁻-type active base region 66 in the n-type silicon layer 44 as shown. The resultant structure is heated so that the arsenic atoms in the n⁺-type emitter contact region 78 are outdiffused into the active base region 66 in the silicon layer 44 and form an n⁺-type emitter region 80 within the base region 66. The structure shown in FIG. 2F is obtained at this stage of the device fabrication process.

Figure 2I:
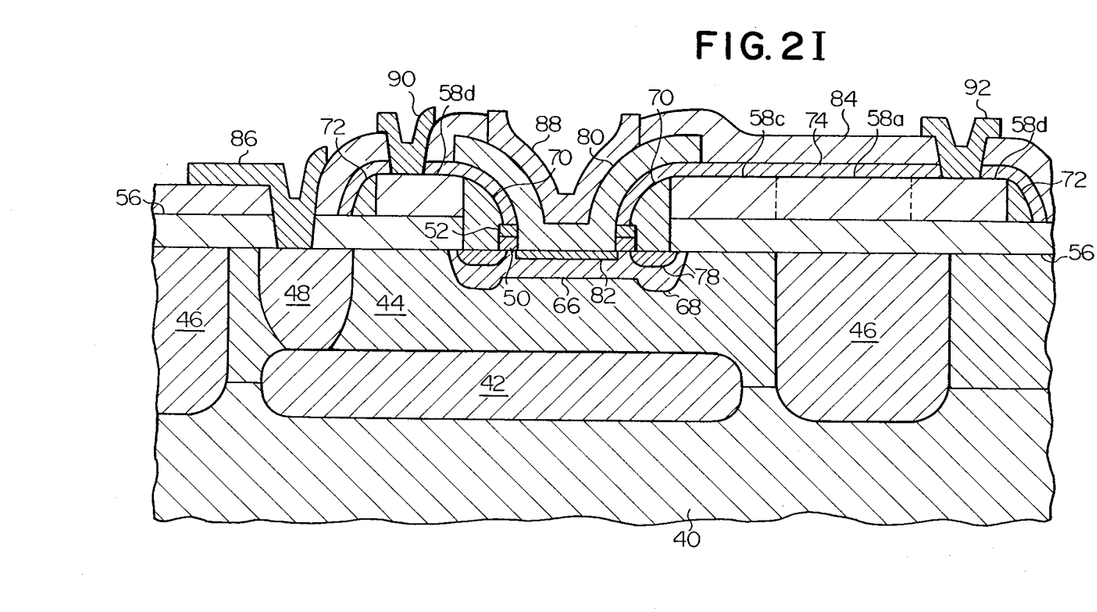

(9) As shown in FIG. 2I, an interlevel insulation layer 82 of, for example, silicon oxide is then formed on the whole structure as by chemical vapor deposition techniques and is patterned and etched to form contact holes for the base, emitter and collector of the device to be fabricated. A metallization layer is thereafter formed and selectively etched away to provide patterned contact and wiring regions. These contact and wiring regions include a collector contact region 84 extending through the silicon oxide layers 82 and 56 to the n⁺-type collector lead region 48, an emitter wiring region 86 extending through the silicon oxide layer 82 to the n⁺-type emitter contact region 78. The metallized contact and wiring regions further include a first base wiring region 88 extending through the oxide layer 82 to the first wiring strap portion 58c, and a second base wiring region 90 extending through the oxide layer 82 to the second wiring strap portion 58d. Of these two base wiring regions 88 and 90, the first base wiring region 88 held in direct contact with the heavily doped wiring strap portion 58c may be used where there is a requirement for a relatively small base resistance. The second base wiring region 90 connected to the strap portion 58c through the lightly doped, highly resistive portion 58a of the polysilicon layer 58 may be used where there is a requirement for a relatively large base resistance.

A bipolar transistor device is thus fabricated which comprises the active base region 66, marginal base region 68, base contact region 78 and emitter region 80. These regions 66, 68, 78 and 80 are all self-aligned through the base contact hole provided by the opening 64 formed at the process stage shown in FIG. 2D and contribute to micro-miniaturization of the device structure. The opening 64 is formed simply and precisely by the selective etching of the silicon oxide layer 56 with the polysilicon layer 58 used as a mask without having recourse to the formation of an extra polysilicon layer to provide a mask region 22 for the patterning and etching of the oxide layer 56.

Furthermore, it is of importance that only small fragments of the initially formed silicon nitride film 52 are left in the substrate structure fabricated at the earliest stage (FIG. 2A) of the device fabrication process. The high-temperature processes required for the chemical vapor deposition and thermal oxidation steps can therefore be performed without consequent warp of the substrate so that the various layers and regions to be formed on the substrate subsequently to the earliest device fabrication stage can be patterned with satisfactory degrees of accuracy. This will lend itself to increasing yield of the device fabrication and accordingly to reducing the production cost of the device on a monolithic semiconductor integrated circuit chip.

While a process according to the present invention has thus far been described as being applied to the fabrication of the semiconductor device of the bipolar type, it will be apparent that another type of semiconductor device such as a diode may be fabricated using the process herein proposed.

What is claimed is:

1. A process of fabricating a semiconductor device comprising the steps of
   (a) preparing a doped semiconductor layer,
   (b) forming a dielectric layer overlying the doped semiconductor layer,
   (c) forming a first insulator layer on the dielectric layer,
   (d) selectively etching said dielectric layer and said insulator layer to form a bump region comprising coextensively patterned portions of the dielectric and insulator layers,
   (e) forming a second insulator layer partly on said doped semiconductor layer and partly on said bump region,
   (f) conformally forming on the second insulator layer an undoped polycrystalline semiconductor layer having a step portion,
   (g) forming on the polycrystalline semiconductor layer a planarizing layer covering the step portion of the polycrystalline semiconductor layer,
   (h) etching back said polycrystalline semiconductor layer and said planarizing layer until said second insulator layer has a surface portion exposed over said bump region,
   (i) selectively etching said first and second insulator layers with the remaining portion of said polycrystalline semiconductor layer used as a mask for forming an opening in part extending to the surface of said dielectric layer and having a marginal groove portion extending to the surface of said doped semiconductor layer, and
   (j) thereafter forming various desired device regions through and in alignment with said opening.

2. A process of fabricating a semiconductor device as set forth in claim 1, in which said dielectric layer comprises a thermal stress relieving insulator film formed on said doped semiconductor layer and a dielectric film formed on the stress relieving insulator film, said stress relieving insulator film being etched together with said dielectric film and said first insulator layer so that said bump region comprises a portion of the stress relieving film in addition to patterned portions of said dielectric film and said insulator layer.

3. A process of fabricating a semiconductor device as set forth in claim 1 or 2, in which said doped semiconductor layer has a first conductivity type, said process further comprising the step of doping a desired portion of said polycrystalline semiconductor layer to a second conductivity type opposite to said first conductivity type with another portion of the polycrystalline semiconductor layer substantially left undoped, the polycrystalline semiconductor layer being doped after the polycrystalline semiconductor layer and said planarizing layer are etched back and before said first and second insulator layers are etched to form said opening.

4. A process of fabricating a semiconductor device as set forth in claim 3, in which said desired portion of said polycrystalline semiconductor layer is at least in part located in proximity to said bump region and the undoped portion of the polycrystalline semiconductor layer is spaced apart from said bump region across said desired portion of the polycrystalline semiconductor layer.

5. A process of fabricating a semiconductor device as set forth in claim 2, in which said dielectric film differs in material from each of said first and second insulator layers and said stress relieving film.

6. A process of fabricating a semiconductor device as set forth in claim 1 or 2, in which said polycrystalline semiconductor layer and said planarizing layer are etched back at substantially equal etch rates for the polycrystalline semiconductor and planarizing layers.

7. A process of fabricating a semiconductor device as set forth in claim 1 or 2, in which the groove portion of said opening has a width substantially equal to the thickness to which said second insulator layer is formed.

8. A process of fabricating a semiconductor device as set forth in claim 1 or 2, in which said doped semiconductor layer has a first conductivity type and in which said desired device regions form part of a bipolar transistor device and are formed by
   (j-1) injecting a dopant of a second conductivity type opposite to said first conductivity type into said doped semiconductor layer through said opening with said polycrystalline semiconductor layer and said second insulator layer used as masks for thereby forming a doped active base region below said dielectric layer and a doped marginal base region underneath the groove portion of said opening and surrounding the active base region, said polycrystalline semiconductor layer herein constituting a first polycrystalline semiconductor layer,
   (j-2) conformally forming a second polycrystalline layer on the resultant structure,
   (j-3) anisotropically etching the second polycrystalline layer for forming a filament region on the side wall of the doped portion of said first polycrystalline semiconductor layer, the filament region extending to the surface of said marginal base region in said doped semiconductor layer and filling up the groove portion of said opening,
   (j-4) forming a third insulator layer covering said first polycrystalline semiconductor layer and said filament region and terminating at the surface of said dielectric layer, said filament region being converted into an integral side wall of the doped portion of said first polycrystalline semiconductor layer by outdiffusion of the dopant from the doped portion,
   (j-5) selectively etching said third insulator layer on said dielectric layer,
   (j-6) etching away an exposed portion of said dielectric layer with said third insulator layer used as a mask, (j-7) forming on the resultant structure a patterned third polycrystalline semiconductor layer doped with a dopant of said second conductivity type and extending into contact with the surface of said active base region in said doped semiconductor layer, and (j-8) heating the resultant structure for forming an emitter region within said active base region by outdiffusion of the dopant from said third polycrystalline semiconductor layer, 9. A process of fabricating a semiconductor device as set forth in claim 8, in which a heavily doped base contact area is formed within said marginal base region immediately below said integral side wall portion of said first polycrystalline semiconductor layer with the dopant in said doped portion of said first polycrystalline semiconductor layer further outdiffused through said filament region into said marginal base region within said doped semiconductor layer.

* * * * *